United States Patent
Bichler et al.

(10) Patent No.: US 11,326,098 B2
(45) Date of Patent: May 10, 2022

(54) LUMINESCENT SUBSTANCE AND ILLUMINATING DEVICE

(71) Applicant: OSRAM OLED GmbH, Regensburg (DE)

(72) Inventors: Daniel Bichler, Augsburg (DE); Thorsten Schroeder, Munich (DE); Gina Maya Achrainer, Greifenberg (DE); Christian Koch, Wehringen (DE); Simon Dallmeir, Biessenhofen (DE)

(73) Assignee: OSRAM OLED GmbH, Regensburg (DE)

( * ) Notice: Subject to any disclaimer, the term of this patent is extended or adjusted under 35 U.S.C. 154(b) by 0 days.

(21) Appl. No.: 17/251,271

(22) PCT Filed: Jun. 5, 2019

(86) PCT No.: PCT/EP2019/064709
§ 371 (c)(1),
(2) Date: Dec. 23, 2020

(87) PCT Pub. No.: WO2019/238506
PCT Pub. Date: Dec. 19, 2019

(65) Prior Publication Data
US 2021/0253951 A1  Aug. 19, 2021

(30) Foreign Application Priority Data

Jun. 13, 2018  (DE) ............... 10 2018 004 751.3

(51) Int. Cl.
*C09K 11/77* (2006.01)
*H01L 33/50* (2010.01)

(52) U.S. Cl.
CPC .......... *C09K 11/7734* (2013.01); *H01L 33/50* (2013.01)

(58) Field of Classification Search
CPC ..................... C09K 11/7734; H01L 33/50
(Continued)

(56) References Cited

U.S. PATENT DOCUMENTS 10,519,371 B2 *  12/2019  Seibald ............... H01L 33/502
2002/0190240 A1  12/2002  Feldmann et al.
(Continued)

FOREIGN PATENT DOCUMENTS

JP          H0578659 A      3/1993
JP          2004067739 A    3/2004
(Continued)

OTHER PUBLICATIONS

International Search report based on PCT Application No. PCT/EP2019/064709 (11 pages) dated Aug. 21, 2019 (for reference purposes only).
(Continued)

*Primary Examiner* — Christopher M Raabe
(74) *Attorney, Agent, or Firm* — Viering, Jentschura & Partner mbB (57) ABSTRACT

A luminophore may have the general empirical formula $X_3A_7Z_3O_{11}:E$, where:
X=Mg, Ca, Sr, Ba, and/or Zn;
A=Li, Na, K, Rb, Cs, Cu, and/or Ag;
Z=Al, Ga, and/or B; and
E=Eu, Ce, Yb, and/or Mn.

13 Claims, 5 Drawing Sheets

(58) Field of Classification Search
USPC .......................................................... 313/503
See application file for complete search history.

(56) References Cited

U.S. PATENT DOCUMENTS

| | | |
|---|---|---|
| 2008/0116421 A1 | 5/2008 | Wang et al. |
| 2016/0096991 A1* | 4/2016 | Hirosaki ............ C09K 11/7792 257/98 |

FOREIGN PATENT DOCUMENTS

| | | |
|---|---|---|
| JP | 5323286 B1 | 8/2016 |
| WO | 2014033951 A1 | 3/2014 |
| WO | 2016150547 A1 | 9/2016 |

OTHER PUBLICATIONS

International Search Report issued for the corresponding International Application No. PCT/EP2019/064709, dated Aug. 21, 2019, 2 pages (for informational purposes only).
Search Report for the German patent applicaiton No. 10 2018 004 751.3 dated Feb. 1, 2019, 5 pages (for reference purposes only).

* cited by examiner

ND ILLUMINATING DEVICE

LUMINESCENT SUBSTANCE AND ILLUMINATING DEVICE

CROSS-REFERENCE TO RELATED APPLICATIONS

The present application is a national stage entry according to 35 U.S.C. § 371 of PCT application No.: PCT/EP2019/064709 filed on Jun. 5, 2019; which claims priority to German Patent Application Serial No.: 10 2018 004 751.3 filed on Jun. 13, 2018; all of which are incorporated herein by reference in their entirety and for all purposes.

TECHNICAL FIELD

The disclosure relates to a phosphor and to an illumination device that especially comprises the phosphor.

BACKGROUND

White-emitting conversion LEDs typically use a semiconductor chip that emits a blue primary radiation and a red and green phosphor. A disadvantage of this solution is that the epitaxially grown semiconductor chips, based on GaN or InGaN, can exhibit fluctuations in the peak wavelength of the primary radiation emitted. This leads to fluctuations in the white overall radiation, such as a change in the color locus and in the color rendering, since the primary radiation contributes the blue component to the overall radiation. This is problematic particularly when using a plurality of semiconductor chips in one device.

In order to prevent fluctuations, the semiconductor chips are sorted in accordance with their color loci ("binning"). The narrower the tolerances set with regard to the wavelength of the primary radiation emitted, the higher the quality of conversion LEDs consisting of more than one semiconductor chip. But even after sorting with narrow tolerances, the peak wavelength of the semiconductor chips can change significantly at variable operating temperatures and forward currents. In general lighting and other applications, this can lead to a change in the optical properties, such as the color locus and color temperature.

On the other hand, the use of a blue-green emitting phosphor in conjunction with a semiconductor chip that emits primary radiation in the UV to blue region is able to emit blue-green radiation that is constant over a broader temperature and forward current range.

A known blue-green phosphor for conversion LEDs is $Ca_8Mg(SiO_4)_4Cl_2:Eu$. However, conversion LEDs comprising this phosphor have inadequate color purity and are unable to achieve defined color loci, and they are therefore not an option for many "color on demand" applications.

There is thus a need for phosphors that emit in the blue-green region of the spectrum.

SUMMARY

An object is to provide a phosphor that emits radiation in the blue-green region of the spectrum. A further object is to specify an illumination device comprising the advantageous phosphor described herein.

This object/these objects are achieved by a phosphor and an illumination device as described in the independent claims. Advantageous embodiments and developments are the subject of the respective dependent claims.

A phosphor is specified. The phosphor has the general empirical formula $X_3A_7Z_3O_{11}:E$, wherein X=Mg, Ca, Sr, Ba, and/or Zn;
A=Li, Na, K, Rb, Cs, Cu, and/or Ag;
Z=Al, Ga, and/or B. The phosphor is doped with an activator E, wherein E=Eu, Ce, Yb, and/or Mn. More particularly, the activator is responsible for the emission of radiation from the phosphor.

Here and hereinbelow, phosphors are described on the basis of empirical formulas. In the stated empirical formulas, it is possible for the phosphor to include further elements, for example in the form of impurities, these impurities taken together optionally comprising a proportion by weight in the phosphor of not more than 1 part per thousand or 100 ppm (parts per million) or 10 ppm.

On excitation with primary radiation, the phosphors surprisingly exhibit an emission or secondary radiation in the blue-green region of the spectrum and additionally exhibit a small full width at half maximum (FWHM).

The full width at half maximum is here and hereinbelow understood as meaning the spectral width at half the height of the maximum of an emission peak or emission band.

In at least one embodiment, E is at least Eu, such as-at least $Eu^{2+}$. Eu or $Eu^{2+}$ may be combined with Ce, Yb, and/or Mn. For example, E=Eu or $Eu^{2+}$.

The use of the activators Eu, Ce, Yb and/or Mn, in particular Eu or Eu in combination with Ce, Yb, and/or Mn, allows the color locus of the phosphor in the CIE color space, the peak wavelength ($\lambda_{peak}$) and dominant wavelength ($\lambda_{dom}$) thereof, and the full width at half maximum to be adjusted particularly readily.

The "peak wavelength" refers here to the wavelength in the emission spectrum of a phosphor at which the emission spectrum or emission band shows maximum intensity.

The dominant wavelength is a means of describing non-spectral (polychromatic) light mixtures through spectral (monochromatic) light that produces a similar perception of hue. In the CIE color space, the line connecting a point for a specific color and the point CIE-x=0.333, CIE-y=0.333 can be extrapolated so that it meets the perimeter of the space at two points. The point of intersection that is closer to said color represents the dominant wavelength of the color as the wavelength of the pure spectral color at this point of intersection. The dominant wavelength is thus the wavelength that is perceived by the human eye.

In a further embodiment, the activator E may be present in mol % amounts of between 0.1 mol % to 20 mol %, 1 mol % to 10 mol %, 0.5 mol % to 5 mol %, 2 mol % to 5 mol %. If the concentration of E is too high, this can lead to a loss of efficiency due to concentration quenching. Here and hereinbelow, values in mol % for the activator E, in particular Eu, are understood as meaning in particular values in mol % based on the molar proportions of X in the respective phosphor.

In at least one embodiment, the phosphor has the general empirical formula $X_3A_7Z_3O_{11}:E$, wherein
X=Mg, Ca, Sr, and/or Ba;
A=Li, Na, K, Rb, Cs, Cu, and/or Ag;
Z=Al, Ga, and/or B and
E=Eu, Ce, Yb, and/or Mn. The use of alkaline earth metals for X results in particularly stable phosphors.

In at least one embodiment, the phosphor has the general empirical formula $(Ba_{1-x}X^*_x)_3A_7Z_3O_{11}:E$, wherein
$X^*$=Mg, Ca, and/or Sr;
A=Li, Na, K, Rb, Cs, Cu, and/or Ag;
Z=Al, Ga, and/or B;
E=Eu, Ce, Yb, and/or Mn and
$0 \leq x \leq 1$, such as $0 \leq x < 1$, or $0 \leq x \leq 0.5$, or $0 \leq x \leq 0.25$.

In at least one embodiment, the phosphor has the general empirical formula $(Ba_{1-x}X^*_x)_3A_7Z_3O_{11}{:}E$, wherein X*=Mg, Ca, and/or Sr
A=Li, Na, K, Rb, and/or Cs;
Z=Al, Ga, and/or B and
E=Eu, Ce, Yb, and/or Mn and
$0 \le x \le 1$, such as $0 \le x < 1$, or $0 \le x \le 0.5$, or $0 \le x \le 0.25$.

Varying the proportion of Ba in the phosphor advantageously allows the position of the peak wavelength to be influenced. In particular, phosphors with a high barium content have been found to be particularly stable in respect of the position of the color locus of the emitted radiation over a wide temperature and forward current range.

In at least one embodiment, the phosphor has the general empirical formula $(Ba_{1-x}X^*_x)_3A_7(Al_{1-y}Ga_y)_3O_{11}{:}E$, wherein X*=Mg, Ca, and/or Sr;
A=Li, Na, K, Rb, and/or Cs;
E=Eu, Ce, Yb, and/or Mn;
$0 \le y \le 1$, $0 \le y \le 0.5$, or $0 \le y \le 0.25$, or $0 \le y \le 0.1$ and
$0 \le x \le 1$, such as $0 \le x < 1$, or $0 \le x \le 0.5$, or $0 \le x \le 0.25$.

Varying the proportion of gallium allows the color locus of the emission of the phosphor to be shifted and thus tailored according to the use in the individual case. In a non-limiting embodiment $0 \le y \le 0.1$ and $0 \le x \le 0.25$, and in another embodiment y=0 and x=0.

In at least one embodiment, the phosphor has the general empirical formula $Ba_3A_7Al_3O_{11}{:}E$, wherein A=Li, Na, K, Rb, and/or Cs and
E=Eu, Ce, Yb, and/or Mn.

In at least one embodiment, the phosphor has the general empirical formula $Ba_3Li_7Al_3O_{11}{:}E$, wherein E=Eu, Ce, Yb, and/or Mn, such as E=Eu, or E=$Eu^{2+}$.

On excitation with primary radiation from the UV to blue region of the spectrum, the phosphor $Ba_3Li_7Al_3O_{11}{:}E$ emits secondary radiation from the blue-green region of the spectrum. Compared to a typical emission of a blue semiconductor chip, the peak wavelength of the phosphor is shifted into the long-wave region of the electromagnetic spectral range and thus has higher luminous efficacy as a consequence of greater overlap with the human eye sensitivity curve having a maximum at 555 nm. This allows the phosphor to provide illumination devices that have comparatively high luminous efficacy.

In at least one embodiment, the phosphor crystallizes in a cubic crystal system. In a non-limiting embodiment, the phosphor crystallizes in the cubic space group Fm$\overline{3}$m.

No efficient phosphors that crystallize in the cubic space group Fm$\overline{3}$m have up to now been known to the inventors. Surprisingly, these phosphors have been found to be particularly efficient. On excitation with primary radiation in the region between 330 nm and 450 nm, these phosphors emit secondary radiation in the blue-green region of the electromagnetic spectrum, in particular secondary radiation having a peak wavelength of between 470 and 520 nm, such as between 480 nm and 500 nm, and a full width at half maximum of below 60 nm, such as below 50 nm. The position of the dominant wavelength or peak wavelength alongside the small full width at half maximum make the phosphors attractive for many lighting applications.

In at least one embodiment, the phosphor is capable of absorbing primary radiation from the UV to blue region of the spectrum and converting it into secondary radiation that has a peak wavelength $\lambda_{peak}$ of between 470 and 520 nm, such as between 480 nm and 500 nm.

In addition, in at least one embodiment the phosphor has a small full width at half maximum of <60 nm, such as <50 nm.

The inventors have thus recognized that a novel phosphor having advantageous properties can be provided that could not previously be provided.

The process for producing the phosphors is very simple to execute compared to many other production processes for phosphors. In particular, the synthesis takes place at moderate temperatures and is therefore very energy-efficient. The demands placed e.g. on the furnace used are accordingly low. The starting materials are commercially available at low cost and are non-toxic.

The disclosure also relates to an illumination device. More particularly, the illumination device comprises the phosphor. All explanations and definitions relating to the phosphor likewise apply to the illumination device and vice versa.

In at least one embodiment, the illumination device includes a semiconductor layer sequence. The semiconductor layer sequence is configured for the emission of electromagnetic primary radiation.

In at least one embodiment, the semiconductor layer sequence includes at least one III-V compound semiconductor material. The semiconductor material is, for example, a nitride compound semiconductor material such as $Al_nIn_{1-n-m}Ga_mN$, wherein in each case $0 \le n \le 1$, $0 \le m \le 1$, and $n+m \le 1$. The semiconductor layer sequence may include dopants and additional constituents. However, for simplicity only the key constituents of the semiconductor layer sequence, that is to say Al, Ga, In, and N, are specified, even though these may be partly replaced and/or supplemented by small amounts of other substances. More particularly, the semiconductor layer sequence is formed from InGaN.

The semiconductor layer sequence includes an active layer that has at least one p-n junction and/or one or more quantum well structures. When the illumination device is in operation, electromagnetic radiation is generated in the active layer. A wavelength or the emission maximum of the radiation is optionally in the ultraviolet and/or visible region, in particular at wavelengths between 330 nm and 450 nm inclusive, for example between 400 nm and 450 nm inclusive.

In at least one embodiment, the illumination device is a light-emitting diode (LED), in particular a conversion LED. The illumination device is then optionally configured to emit white or colored light.

In combination with the phosphor present in the illumination device, the illumination device is optionally configured to emit blue to blue-green light in partial conversion or white light in full conversion.

The blue-green region of the spectrum can be understood as meaning in particular the region of the electromagnetic spectrum between 470 nm and 520 nm, such as between 480 nm and 500 nm.

The illumination device includes a conversion element. More particularly, the conversion element comprises the phosphor or consists thereof. The phosphor at least partly or fully converts the electromagnetic primary radiation into electromagnetic secondary radiation.

In at least one embodiment, the conversion element or illumination device includes no further phosphor besides the phosphor. The conversion element may also consist of the phosphor. The phosphor is optionally configured for partial conversion of the primary radiation. The overall radiation of the illumination device is thus a mixed radiation of the primary and secondary radiation. In particular, a wavelength or the emission maximum of the primary radiation is in the visible blue region, in particular at wavelengths between 400 nm and 450 nm inclusive. With the illumination device according to this embodiment it is advantageously possible to achieve many color loci in the blue to blue-green region of the electromagnetic spectrum. It is thus possible to define the color locus in accordance with customer-specific requirements ("color on demand").

The illumination devices of this embodiment are suitable, for example, for signal lights such as blue lights for e.g. police cars, ambulances, emergency medical vehicles or fire engines. Since these signal lights need to be both very bright and to be within a defined color locus range, not all blue light sources are suitable for this use. With illumination devices that emit blue to blue-green light, it is surprisingly possible to meet the requirements of the ECE regulations for signal lights. In at least one embodiment, the overall radiation of the illumination device is a white mixed radiation.

The illumination device emitting white mixed radiation is suitable for general lighting, for example for offices. The phosphor described here has large overlap with the melanopic curve. Radiation emitted by the phosphor and by the white-emitting illumination device can thus advantageously reduce tiredness and boost the ability to concentrate.

In at least one embodiment, the conversion element includes a second and/or third phosphor besides the phosphor. The phosphors are for example embedded in a matrix material. Alternatively, the phosphors may also be present in a converter ceramic.

The illumination device may include a second phosphor for the emission of radiation from the green region of the spectrum.

The green region of the spectrum can be understood as meaning in particular the region of the electromagnetic spectrum between 525 nm and 560 nm inclusive.

Additionally or alternatively, the illumination device may include a third phosphor. The third phosphor may be configured for the emission of radiation from the orange-red region of the spectrum. In other words, the illumination device then has at least three phosphors: the blue-green-emitting phosphor, an orange-red-emitting phosphor, and a green-emitting phosphor. The illumination device is configured in particular for full conversion, the primary radiation optionally being selected from the UV to blue region of the spectrum and optionally being fully converted. The resulting overall radiation of the illumination device is then in particular a white mixed radiation. Fluctuations in the overall white radiation, such as a change in the color locus and in color rendering, caused by the primary radiation can largely be avoided, since the blue-green component of the overall radiation corresponds to the secondary radiation of the phosphor and the primary radiation makes little or no contribution to the overall radiation.

The orange-red region of the spectrum can be understood as meaning the region of the electromagnetic spectrum between 580 nm and 780 nm.

The UV to blue region of the spectrum can be understood as meaning in particular the region of the electromagnetic spectrum between 330 nm and 450 nm, the blue region of the spectrum being understood as the region between 400 and 450 nm inclusive and the UV region of the spectrum understood as the region between 350 nm and 400 nm.

Working Example

A working example WE1 of the phosphor having the empirical formula $Ba_3Li_7Al_3O_{11}$:Eu was produced as follows: $BaCO_3$, $Li_2CO_3$, $Al_2O_3$, and $Eu_2O_3$ were mixed and the mixture was heated in a corundum crucible under $N_2$ or $N_2$ containing up to 7.5% $H_2$ to a temperature of 1200° C. and held at this temperature for 4 h. After cooling, single crystals of the phosphor are obtained.

The starting material weights are shown in Table 1 below.

TABLE 1

| Starting material | Mass/g |
|---|---|
| $BaCO_3$ | 1.4841 |
| $Li_2CO_3$ | 0.2084 |
| $Eu_2O_3$ | 0.0200 |
| $Al_2O_3$ | 0.2875 |

The phosphor starting materials are commercially available, stable, and also very inexpensive. The simple synthesis at comparatively low temperatures makes the phosphor very inexpensive to produce and thus also economically attractive.

Table 2 shows crystallographic data for $Ba_3Li_7Al_3O_{11}$:Eu (WE1). The phosphor crystallizes in the cubic crystal system in the space group Fm $\bar{3}$ m.

TABLE 2

| | WE1 |
|---|---|
| Structure type | $Ba_3Li_7Al_3O_{11}$ |
| Calculated composition | $Ba_3Li_7Al_3O_{11}$:Eu |
| Crystal system | cubic |
| Space group | Fm $\bar{3}$ m |
| Lattice parameters | |
| a/pm | 1318.4(2) pm |
| α | 90 |
| β | 90 |
| γ | 90 |
| Volume/nm³ | 0.2292(1) |
| Density ρ/g cm⁻³ | 4.160 |
| T/K | 296(2) |
| Total reflections | 7061 |
| Independent reflections | 95 |
| Measured reciprocal space | $-13 \leq h \leq 13$ |
| | $-13 \leq k \leq 13$ |
| | $-13 \leq l \leq 13$ |
| $R_{all}$, $wR_{ref}$ | 1.88%, 4.76% |
| GooF | 1.229 |

Table 3 shows the positions of the atoms in the structure of $Ba_3Li_7Al_3O_{11}$:Eu (WE1).

TABLE 3

| Atom | Wyckoff position | x | y | z | Occupation | $U_{iso}$ |
|---|---|---|---|---|---|---|
| Ba01 | 24e | 0.29237(7) | 0.5 | 0.5 | 1 | 0.0201(5) |
| Al02 | 48g | 0.25 | 0.4120(4) | 0.25 | 0.5 | 0.020(3) |
| Li02 | 48g | 0.25 | 0.4120(4) | 0.25 | 0.5 | 0.020(3) |
| O003 | 4a | 0 | 0.5 | 0.5 | 1 | 0.029(7) |
| O004 | 48h | 0.1739(4) | 0.5 | 0.3261(4) | 1 | 0.020(2) |
| O005 | 4b | 0.5 | 0.5 | 0.5 | 1 | 0.018(6) |
| O006 | 32f | 0.1639(5) | 0.3361(5) | 0.1639(5) | 1 | 0.040(3) |
| Li07 | 32f | 0.0932(9) | 0.5932(9) | 0.4068(9) | 1 | 0.012(5) |

BRIEF DESCRIPTION OF THE DRAWINGS

Further advantageous embodiments and developments arise from the working examples described below in conjunction with the figures. The accompanying drawings serve to afford an understanding of various embodiments. The drawings illustrate embodiments and together with the description serve to elucidate same. Further embodiments and numerous advantages from among those intended are evident directly from the following detailed description. The elements and structures shown in the drawings are not necessarily illustrated in a manner true to scale with respect to one another. Identical reference signs refer to identical or mutually corresponding elements and structures.

DETAILED DESCRIPTION

Figure 1:
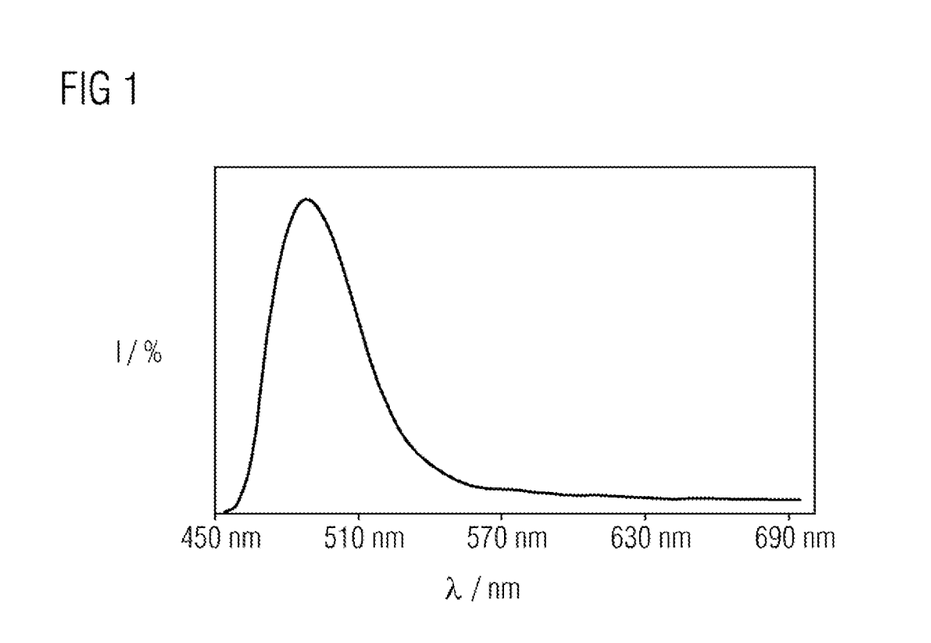
FIGS. 1 and 2 show emission spectra.

FIG. 1 shows the emission spectrum of $Ba_3Li_7Al_3O_{11}$:Eu (WE1). The wavelength in nanometers is plotted on the x axis and the intensity in percent on the y axis. The phosphor has a peak wavelength of about 490 nm and a full width at half maximum of about 45 nm. To measure the emission spectrum, the phosphor was excited in parallel with primary radiation having a peak wavelength of 405 and 440 nm. The phosphor may be present as the sole phosphor in an illumination device or conversion LED that in full conversion emits overall radiation in the blue-green region of the electromagnetic spectrum or in partial conversion emits overall radiation in the blue to blue-green region of the electromagnetic spectrum. The illumination device or conversion LED that in partial conversion emits overall radiation in the blue to blue-green region of the electromagnetic spectrum is suitable, for example, for signal lights such as blue lights for e.g. police cars, ambulances, emergency medical vehicles or fire engines. Although an illumination device or conversion LED comprising the phosphor $Ba_3Li_7Al_3O_{11}$:Eu is able to create the same or similar color impression compared to a blue-emitting semiconductor chip, in other words have the same or very similar CIEx and CIEy values in the CIE color space, the overall radiation is slightly longer-wavelength (with a slightly larger component in the green region of the spectrum) and thereby achieves greater overlap with the eye sensitivity curve. This results in higher eye sensitivity. This means that the color of the overall radiation is perceived by the human eye more clearly and more intensely.

Figure 2:
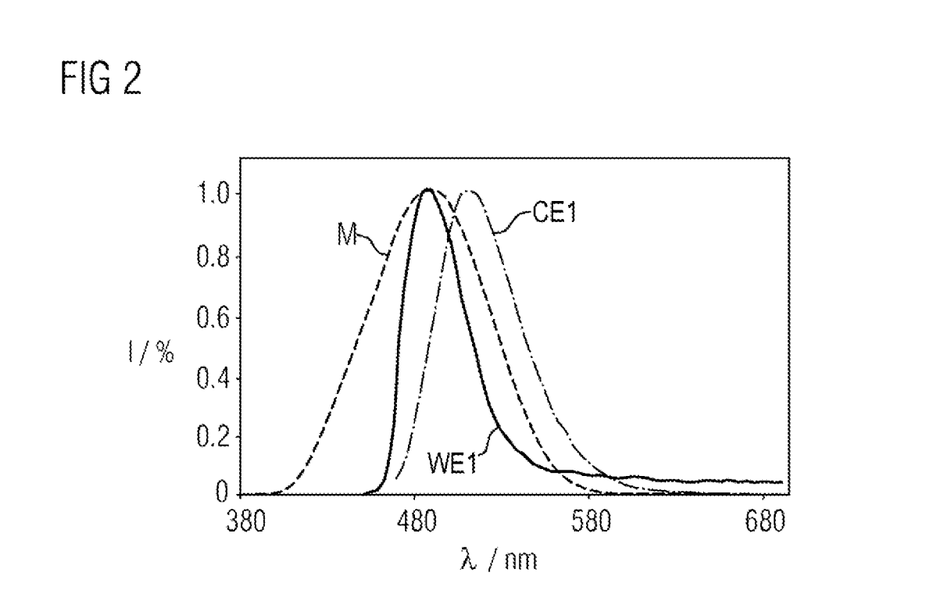

FIG. 2 shows emission spectra of the phosphor WE1 and of a comparative example CE1 $Ca_8Mg(SiO_4)_4Cl_2$:Eu. In addition, FIG. 2 shows the melanopic sensitivity curve M. The melanopic sensitivity curve M shows the wavelengths with which melatonin production in the body can best be suppressed. As can be seen, the emission spectrum of WE1 shows appreciably higher overlap with the melanopic sensitivity curve M than does the emission spectrum of CE1. With the phosphor, it is thus possible to generate melanopic light that may be used to effectively suppress melatonin formation. If a person is exposed to the radiation of an illumination device that comprises the phosphor WE1, this can advantageously result in heightened alertness or increased ability to concentrate. Illumination devices comprising the phosphor can thus be used for room lighting, in particular for "human centric lighting" applications.

Figure 3A:
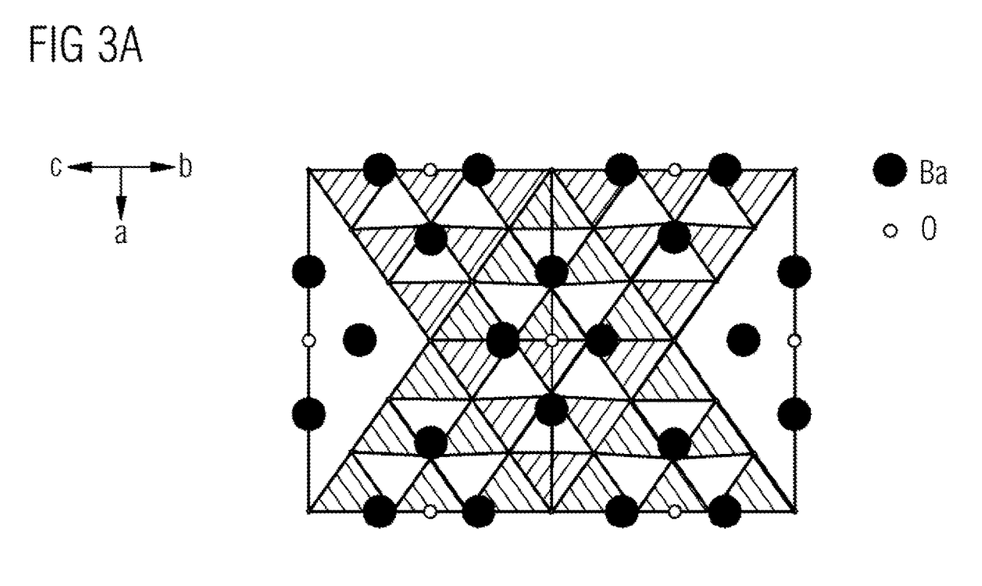
FIGS. 3A, 3B, 3C show sections of the crystal structure of the phosphor.
Figure 3B:
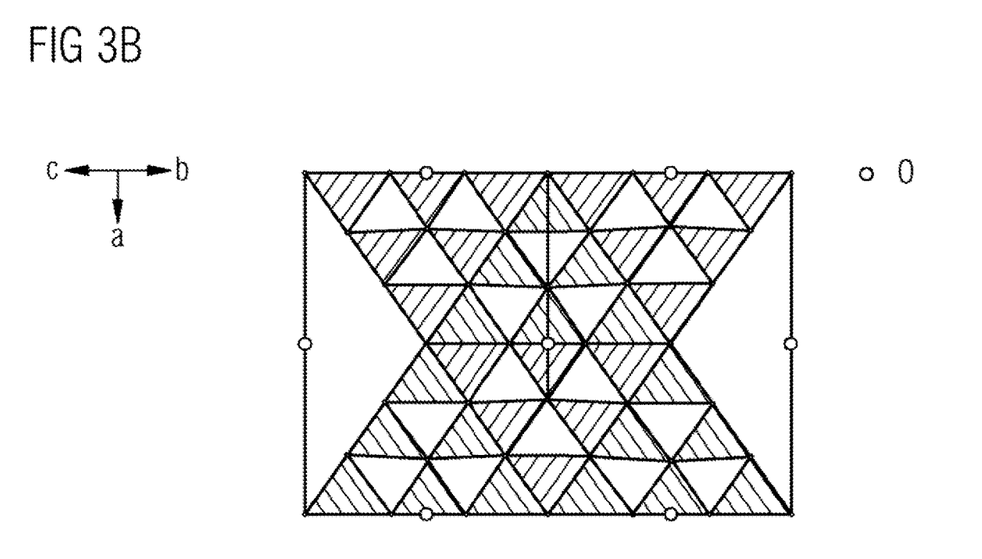
Figure 3C:
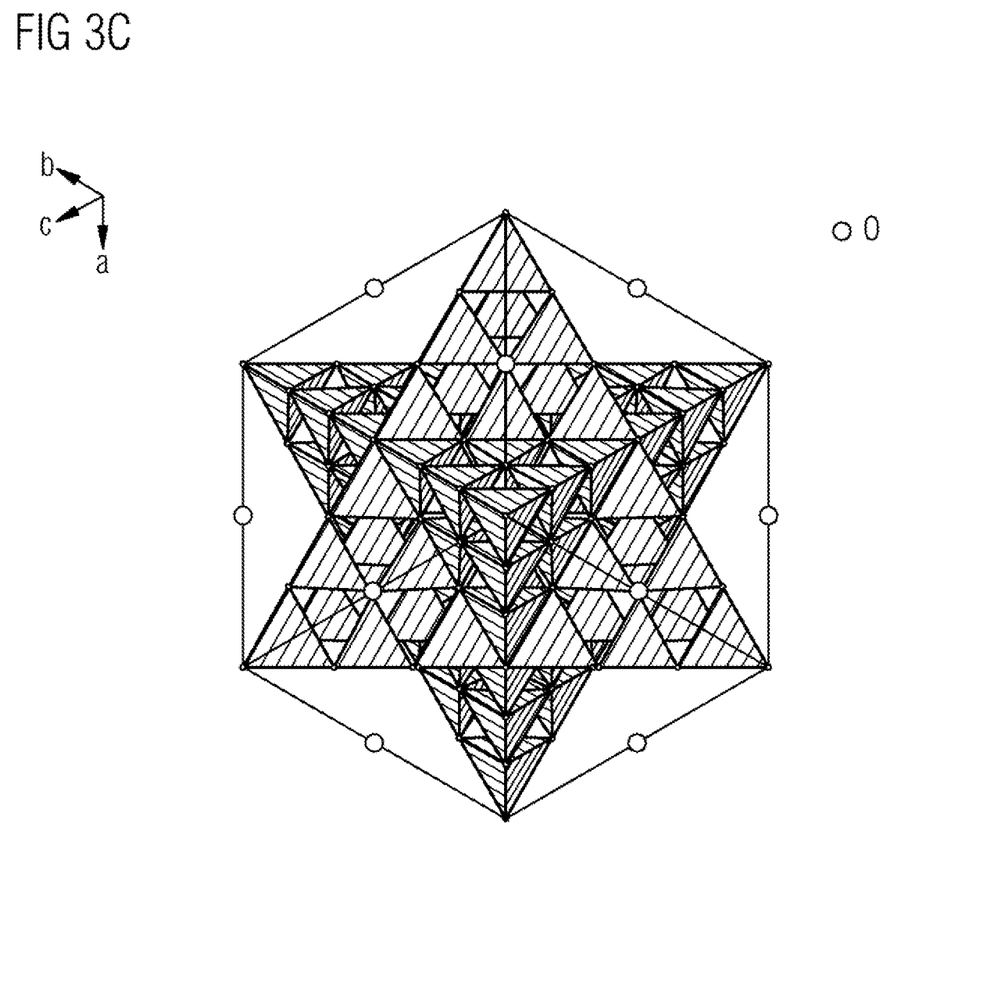

FIGS. 3A, 3B, and 3C each show a section from the crystal structure of the phosphor $Ba_3Li_7Al_3O_{11}$:Eu.

FIG. 3A shows a section of the crystal structure in the direction of view along the face diagonals [011]. The hatched triangles are $LiO_4$ or $AlO_4$ tetrahedra, in which Li or Al are present in the centers and oxygen at the corners of the tetrahedra.

FIG. 3B shows a section of the crystal structure in the direction of view along the face diagonals [011]. The hatched triangles are $LiO_4$ or $AlO_4$ tetrahedra, in which Li or Al are present in the centers and oxygen at the corners of the tetrahedra. In comparison to FIG. 3A, in FIG. 3B the Ba atoms are not shown.

FIG. 3C shows a section of the crystal structure in the direction of view of the space diagonals [111]. The hatched triangles are $LiO_4$ or $AlO_4$ tetrahedra, in which Li or Al are present in the centers and oxygen at the corners of the tetrahedra.

The crystal structure is made up of corner- and edge-linked $LiO_4$ or $AlO_4$ tetrahedra. These form two interpenetrating supratetrahedra, each of which is made up of $LiO_4$ and $AlO_4$ tetrahedra that are linked at their corners on all sides Six $LiO_4$ and six $AlO_4$ tetrahedra in each case form the edge of a supratetrahedron. These interpenetrating supratetrahedra are then linked with other supratetrahedra at their corners to form a network in space. The oxygen atom with the designation O005 at Wyckoff position 4b (Table 3) is the sole oxygen atom that is not involved in this network of tetrahedra. Instead, it is located at the center of an octahedron made up of Ba atoms outside the supratetrahedra. The Ba atoms are in turn each surrounded by nine oxygen atoms at distances of between 273.7 pm and 311.0 pm in a tridecahedral arrangement to form a twisted elongated square pyramid.

Figure 4:
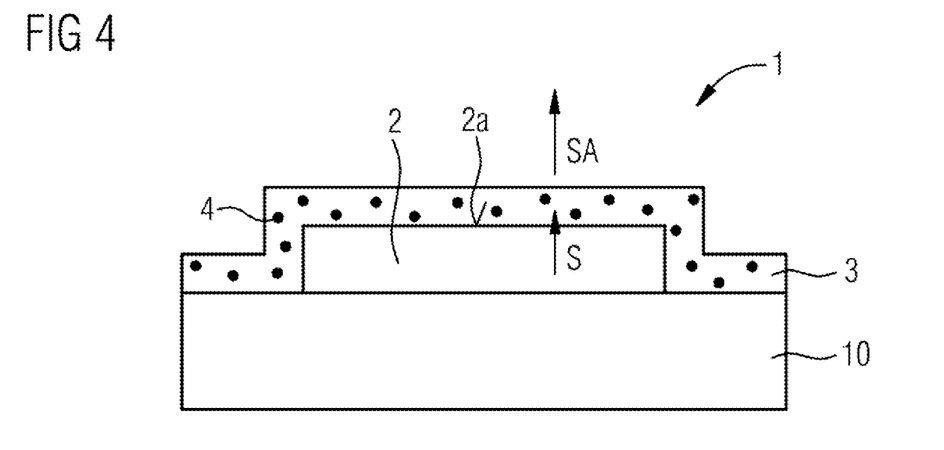
FIGS. 4, 5, and 6 show conversion LEDs.
Figure 5:
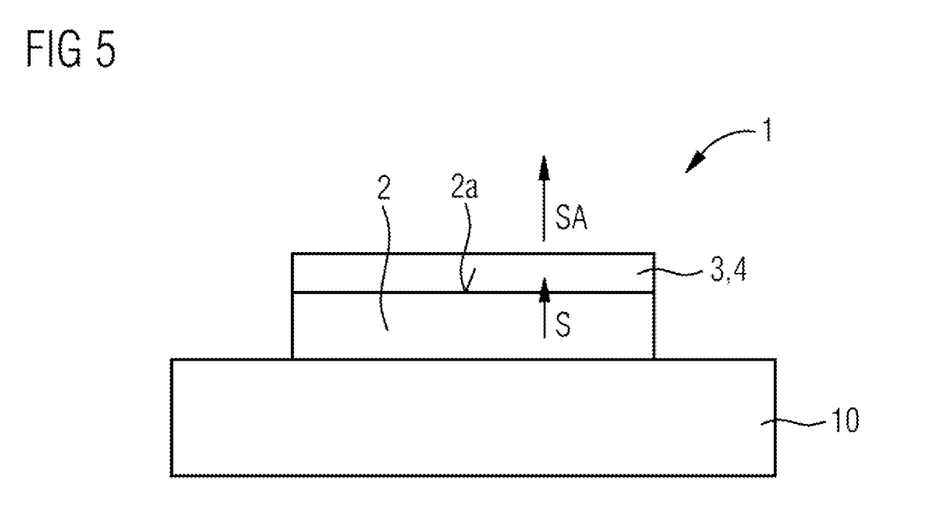
Figure 6:
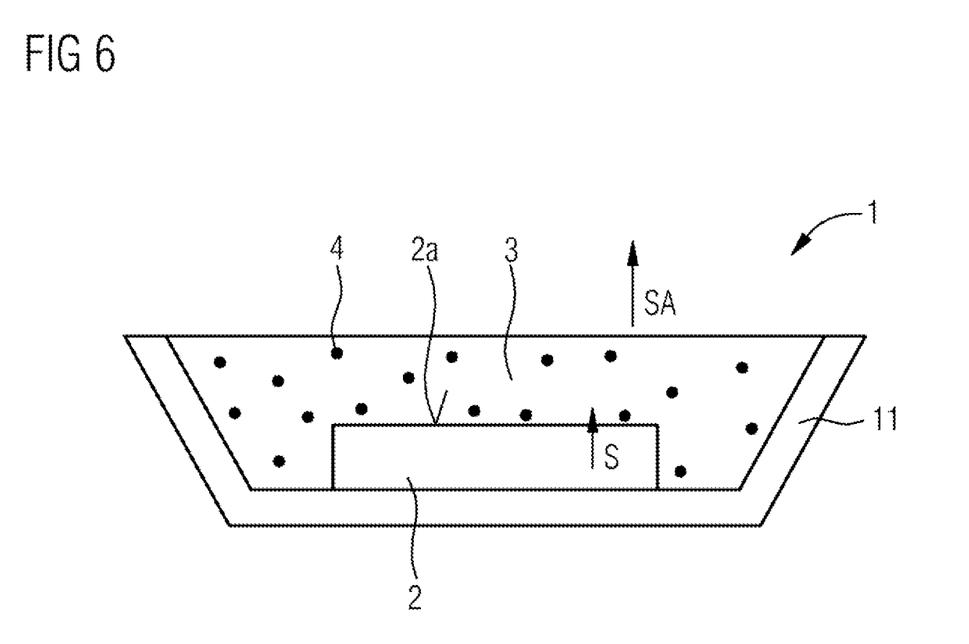

FIGS. 4 to 6 each show schematic side views of different embodiments of the illumination devices described here, in particular conversion LEDs.

The conversion LEDs in FIGS. 4 to 6 include at least one phosphor described herein. In addition, one further phosphor or a combination of phosphors may be present in the conversion LED. The additional phosphors are known to the those skilled in the art and are therefore not mentioned explicitly at this point.

The conversion LED depicted in FIG. 4 has a semiconductor layer sequence 2 disposed atop a substrate 10. The substrate 10 may, for example, be designed to be in reflective form. Disposed atop the semiconductor layer sequence 2 is a conversion element 3 in the form of a layer. The semiconductor layer sequence 2 has an active layer (not shown) which, when the conversion LED is in operation, emits primary radiation having a wavelength of 330 nm and 450 nm inclusive. The conversion element 3 is positioned in the beam path of the primary radiation S. The conversion element 3 comprises a matrix material, for example a silicone, epoxy resin or hybrid material, and particles of the phosphor 4.

For example, the phosphor 4 has an average particle size of 10 μm. When the conversion LED is in operation, the phosphor 4 is capable of converting the primary radiation S at least partly or fully into secondary radiation SA in the blue-green region of the spectrum. In the conversion element 3, the phosphor 4 is distributed homogeneously in the matrix material within the manufacturing tolerance.

Alternatively, the phosphor 4 may also be distributed in the matrix material with a concentration gradient.

Alternatively, the matrix material may also be absent, such that the phosphor 4 takes the form of a ceramic converter.

The conversion element 3 has been applied over the full area of the radiation exit face 2a of the semiconductor layer sequence 2 and of the side faces of the semiconductor layer sequence 2, and is in direct mechanical contact with the radiation exit face 2a of the semiconductor layer sequence 2 and the side faces of the semiconductor layer sequence 2. The primary radiation S may also exit via the side faces of the semiconductor layer sequence 2.

The conversion element 3 may be applied, for example, by injection molding, injection compression molding or spray coating methods. In addition, the conversion LED has electrical contacts (not shown here), the formation and disposition of which are known to those skilled in the art.

Alternatively, it is also possible for the conversion element to have been prefabricated and applied to the semiconductor layer sequence 2 by means of a "pick-and-place" process.

FIG. 5 shows a further working example of a conversion LED 1. The conversion LED 1 has a semiconductor layer sequence 2 atop a substrate 10. The conversion element 3 has been formed atop the semiconductor layer sequence 2. The conversion element 3 takes the form of platelets. The platelet may consist of particles of the inventive phosphor 4 that have been sintered together and hence be a ceramic platelet, or the platelet includes, for example, glass, silicone, an epoxy resin, a polysilazane, a polymethacrylate or a polycarbonate as matrix material with particles of the phosphor 4 embedded therein.

The conversion element 3 has been applied over the full area of the radiation exit face 2a of the semiconductor layer sequence 2. More particularly, no primary radiation S exits via the side faces of the semiconductor layer sequence 2; rather, it exits predominantly via the radiation exit face 2a. The conversion element 3 may have been applied atop the semiconductor layer sequence 2 by means of a bonding layer (not shown), composed for example of silicone.

The conversion LED 1 depicted in FIG. 6 has a housing 11 with a recess. A semiconductor layer sequence 2 having an active layer (not shown) is disposed within the recess. When the conversion LED is in operation, the active layer emits primary radiation S with a wavelength of 330 nm to 450 nm inclusive.

The conversion element 3 takes the form of an encapsulation of the layer sequence in the recess and comprises a matrix material, for example a silicone, and a phosphor 4, for example $Ba_3Li_7Al_3O_{11}$:Eu. When the conversion LED 1 is in operation, the phosphor 4 converts the primary radiation S at least partly into secondary radiation SA. Alternatively, the phosphor converts the primary radiation S fully into secondary radiation SA.

It is also possible that the phosphor 4 in the working examples in FIGS. 4 to 6 is arranged in the conversion element 3 spaced apart from the semiconductor layer sequence 2 or the radiation exit face 2a. This may be achieved for example by sedimentation or by applying the conversion layer atop the housing.

For example, by contrast with the embodiment depicted in FIG. 6, the encapsulation may consist solely of a matrix material, for example silicone, with application, atop the encapsulation, spaced apart from the semiconductor layer sequence 2, of the conversion element 3 as a layer atop the housing 11 and atop the encapsulation.

The working examples and features thereof that have been described in conjunction with the figures may in further working examples also be combined with one another, even when such combinations are not shown explicitly in the figures. In addition, the working examples described in conjunction with the figures may have additional or alternative features in accordance with the description in the general part.

This patent application claims the priority of German patent application 10 2018 004 751.3, the disclosure content of which is hereby incorporated by reference.

LIST OF REFERENCE SIGNS

1 Illumination device or conversion LED
2 Semiconductor layer sequence or semiconductor chip
2a Radiation exit face
3 Conversion element
4 Phosphor
10 Substrate
11 Housing
S Primary radiation
SA Secondary radiation
LED Light-emitting diode
$\lambda_{dom}$ Dominant wavelength
$\lambda_{peak}$ Peak wavelength
ppm Parts per million
WE Working example
CE Comparative example
g Gram
I Intensity
mol % Mole percent
nm Nanometer
° C. Degree Celsius

The invention claimed is:

1. A phosphor having the general empirical formula $X_3A_7Z_3O_{11}$:E, wherein:
   X=Mg, Ca, Sr, Ba, Zn, or combinations thereof;
   A=Li, Na, K, Rb, Cs, Cu, Ag, or combinations thereof;
   Z=Al, Ga, B, or combinations thereof; and
   E=Eu, Ce, Yb, Mn, or combinations thereof.

2. The phosphor as claimed in claim 1, wherein:
   X=Mg, Ca, Sr, and/or Ba;
   A=Li, Na, K, Rb, Cs, Cu, Ag, or combinations thereof;
   Z=Al, Ga, B, or combinations thereof; and
   E=Eu, Ce, Yb, Mn, or combinations thereof.

3. The phosphor as claimed in claim 1, wherein the general empirical formula is $(Ba_{1-x}X^*_x)_3A_7Z_3O_{11}$:E, wherein:
   X*=Mg, Ca, Sr, or combinations thereof;
   A=Li, Na, K, Rb, Cs, Cu, Ag, or combinations thereof;
   Z=Al, Ga, B, or combinations thereof;
   E=Eu, Ce, Yb, Mn, or combinations thereof; and
   $0 \leq x \leq 1$.

4. The phosphor as claimed in claim 3, wherein:
   X*=Mg, Ca, Sr, or combinations thereof;
   A=Li, Na, K, Rb, Cs, or combinations thereof;
   Z=Al, Ga, B, or combinations thereof; and
   E=Eu, Ce, Yb, Mn, or combinations thereof and
   $0 \leq x = 0.25$.

5. The phosphor as claimed in claim 3, wherein the general empirical formula is $(Ba_{1-x}X^*_x)_3A_7(Al_{1-y}Ga_y)_3O_{11}$:E, wherein:
   X*=Mg, Ca, Sr, or combinations thereof;
   A=Li, Na, K, Rb, Cs, or combinations thereof;
   E=Eu, Ce, Yb, Mn, or combinations thereof;
   $0 \leq y \leq 1$ and
   $0 \leq x \leq 1$.

6. The phosphor as claimed in claim 1; wherein the general empirical formula is $Ba_3A_7Al_3O_{11}$:E, wherein:
   A=Li, Na, K, Rb, Cs, or combinations thereof; and
   E=Eu, Ce, Yb, Mn, or combinations thereof.

7. The phosphor as claimed in claim 1 wherein the general empirical formula is $Ba_3Li_7Al_3O_{11}$:E, wherein:
   E=Eu, Ce, Yb, Mn, or combinations thereof.

8. The phosphor as claimed in claim 1, wherein E=Eu.

9. The phosphor as claimed in claim 1, wherein the phosphor crystallizes in a cubic crystal system.

10. The phosphor as claimed in claim 1, wherein the phosphor crystallizes in a in the cubic space group $Fm\bar{3}m$.

11. An illumination device comprising a phosphor as claimed in claim 1.

12. The illumination device as claimed in claim 11, wherein:
   a semiconductor layer sequence configured to emit electromagnetic primary radiation; and
   a conversion element comprising the phosphor; and wherein the conversion element at least partly converts the electromagnetic primary radiation into electromagnetic secondary radiation.

13. The illumination device as claimed in claim 12, wherein the conversion element further comprises:
   a second phosphor configured to emit radiation in the green region of the spectrum; and
   a third phosphor configured to emit radiation in the orange-red region of the spectrum.

* * * * *